United States Patent [19]

Woolcock et al.

[11] 4,234,861
[45] Nov. 18, 1980

[54] ELECTRICAL WINDINGS

[75] Inventors: Alan Woolcock, Lichfield; Bryan W. H. Lowe, Sutton Coldfield; Colin R. Walters, Abingdon, all of England

[73] Assignee: Imi Kynoch Limited, Birmingham, England

[21] Appl. No.: 886,128

[22] Filed: Mar. 13, 1978

[30] Foreign Application Priority Data

Mar. 14, 1977 [GB] United Kingdom ............... 10734/77

[51] Int. Cl.³ .................... H01F 7/22; H01B 12/00
[52] U.S. Cl. ............................ 335/216; 174/15 CA; 174/128 S
[58] Field of Search ............ 174/15 S, 15 CA, 126 S, 174/128 S, 126 CP; 335/216

[56] References Cited

U.S. PATENT DOCUMENTS

| | | | |
|---|---|---|---|
| 3,205,413 | 9/1965 | Anderson | 174/15 CA |
| 3,214,249 | 10/1965 | Bean et al. | 174/126 S |
| 3,466,581 | 9/1969 | Albrecht et al. | 174/128X |
| 3,537,827 | 11/1970 | Benz et al. | 174/126 S UX |
| 3,713,211 | 1/1973 | Freeman, Jr. | 174/15 CA |
| 3,742,116 | 6/1973 | Aupoix et al. | 174/15 S |

Primary Examiner—Arthur T. Grimley
Attorney, Agent, or Firm—Cushman, Darby & Cushman

[57] ABSTRACT

A composite strip for use in the manufacture of superconducting windings consisting of a thin layer of insulating material situated between two layers of metal. The composite strip may be used to form the winding on its own, or it may be used in conjunction with a separate strip conductor. If it is used on its own, one or more of the layers of the composite strip is made to be superconducting. If it is used with a separate superconducting strip, then the metal layers can be made of an alloy such as to assist in thermally stabilizing the superconducting strip. A winding made in such a manner.

13 Claims, 2 Drawing Figures

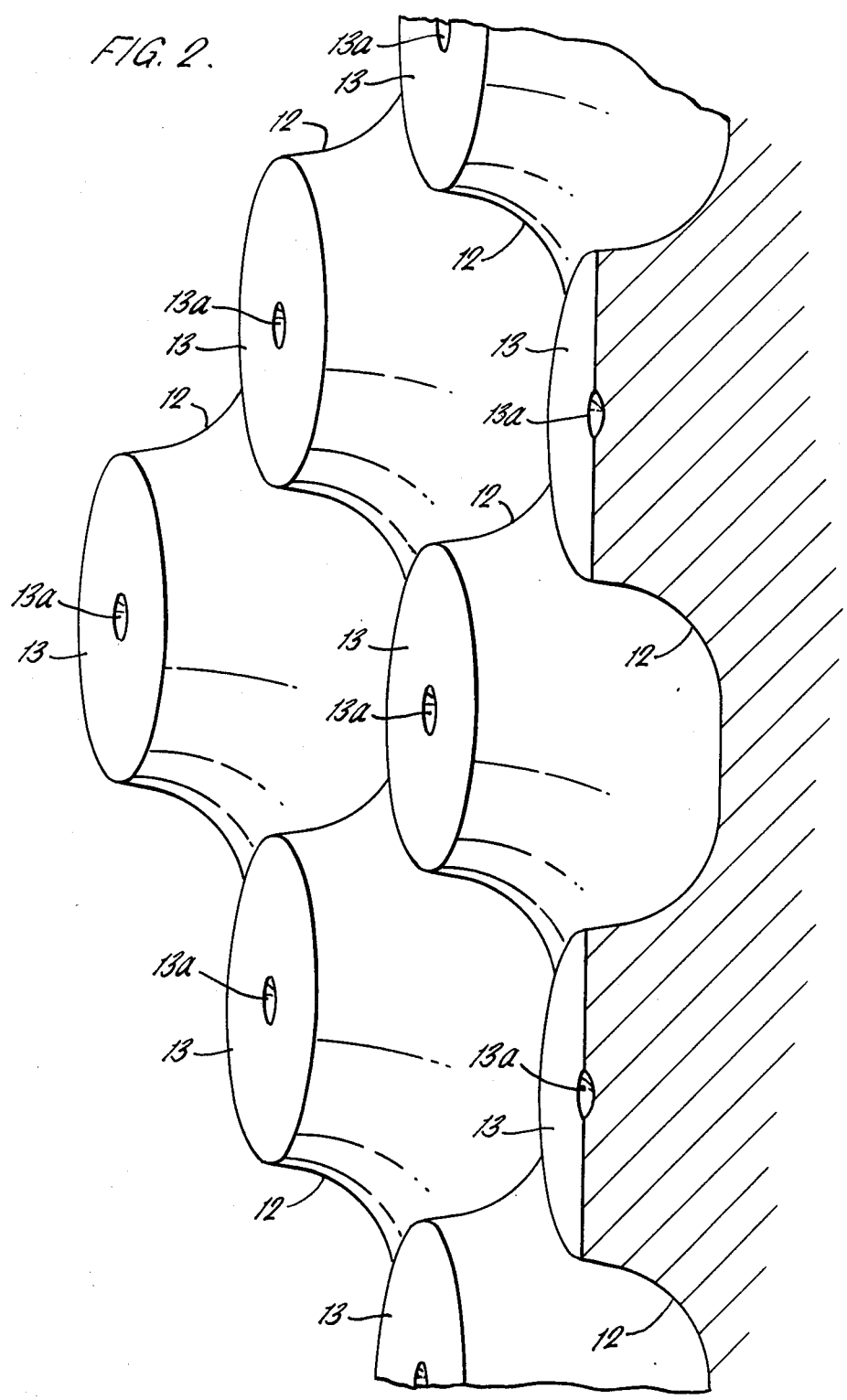

ELECTRICAL WINDINGS

BACKGROUND OF THE INVENTION

The present invention relates to electrical windings the constituent conductors of which are in the form of strips of conducting material. In particular the invention relates to windings incorporating superconducting materials for producing large magnetic fields.

SUMMARY OF THE INVENTION

According to the invention in one aspect there is provided a composite strip for use in the production of an electrical winding the constituent conductor of which is in the form of a strip of material, comprising first and second layers of metal of equal thickness, and a layer of insulating material sandwiched between the metal so as to occupy the neutral axis of the composite strip.

Preferably the insulating material is glass or a ceramic material.

If desired, the metal can be used to form the conductor of the windings. Alternatively a separate conductor can be used, the composite strip and the separate conductor being wound simultaneously during the manufacture of the winding.

If a separate conductor is not used, then the outer surface of one of the metal layers can be provided with flat-topped protrusions of equal height so that when one turn of the winding is superimposed upon another during the manufacture of the winding a plurality of channels is formed through which a cooling medium can be circulated. If a separate conductor is used, the protrusions can be formed either on the surfaces of the separate conductor or they can be formed on the outer surface of each of the metal layers of the composite strip.

According to the invention in another aspect there is provided an electrical winding comprising a plurality of turns of a strip conductor consisting of a layer of a material which can be rendered superconducting sandwiched between two layers of a metallic thermally stabilising material so as to occupy the neutral axis of the strip conductor, and interposed between each turn of strip conductor in the winding a composite strip comprising a layer of insulating material sandwiched between two layers of metal so as to occupy the neutral axis of the composite strip.

Preferably the material which can be rendered superconducting is a niobium-tin alloy, the metallic thermally stabilising material is a zirconium-copper alloy, and the insulating material is glass or a ceramic. In one form of conductor, a layer of niobium-tin alloy is interposed between two layers of a tin-bronze alloy which in turn are sandwiched between two layers of zirconium-copper alloy, upon the outer surfaces of which are formed flat-topped protrusions of equal height, the total area of the tops of the protrusions being approximately half the nominal area of the surfaces of the layers of zirconium copper alloy.

The invention will now be described, by way of example, with reference to the accompanying drawing in which:

BRIEF DESCRIPTION OF THE DRAWINGS

FIG. 2 is a pictorial representation of part of a surface of a component of the winding of FIG. 1.

DESCRIPTION OF THE PREFERRED EMBODIMENT(S)

Figure 1:
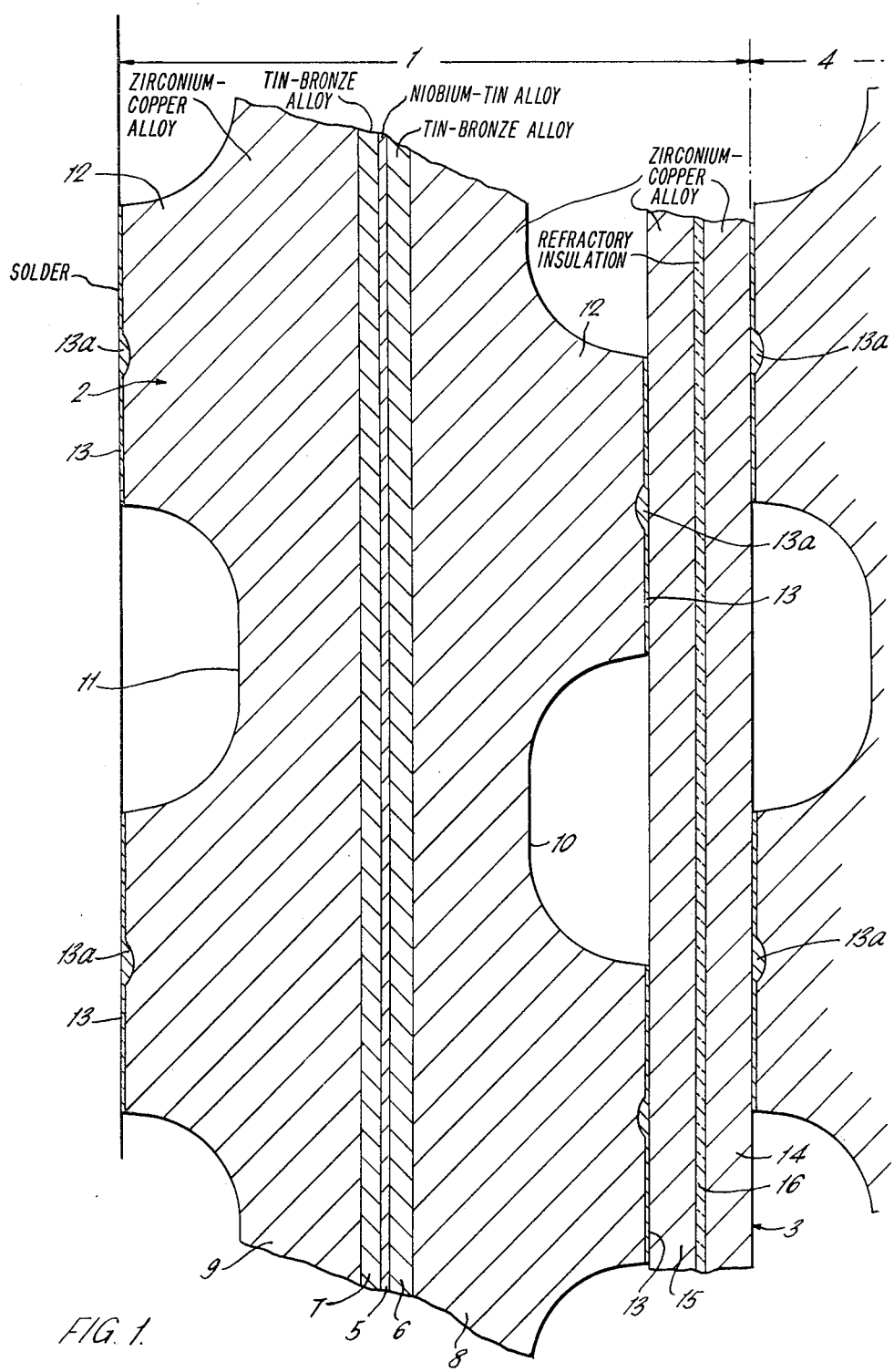
FIG. 1 is a cross-section of one turn of an electrical winding embodying the invention.

Referring to FIG. 1 of the drawings, one turn 1 of an electrical winding the conductor of which is in the form of a strip consists of a conductor strip 2 and a composite strip insulator 3 separating it from the next turn 4 of the winding.

The conductor 2 consists of a layer 5 of a niobium-tin alloy, such as is well-known in the superconducting art, sandwiched between two layers 6 and 7 of a tin-bronze alloy containing some 13% of tin. Soldered to the layers 6 and 7 are layers 8 and 9 of a zirconium-copper alloy containing some 0.18% of zirconium. The purpose of the layers 8 and 9 is to thermally stabilise the superconducting layer 5 so as to prevent the formation of localised normally conducting regions in the layer 5 when an electric current is passed through the winding. The layers 8 and 9 also mechanically support the winding. For small windings where less mechanical support for the winding is required, copper can be used for the layers 8 and 9. The surfaces 10 and 11 of the conductor 2 are provided with protrusions 12 which are all of the same height and flat-topped. The total area of the tops 13 of the protrusions 12 is approximately equal to half the nominal area of the surfaces 10 and 11 of the layers 8 and 9 and the height of the protrusions is approximately equal to the thickness of the layers 8 and 9.

Small depressions 13a are formed in the tops 13 of the protrusions 12. These are filled with solder sufficient to provide a thin layer over the respective tops 13 of the protrusions 12.

A pictorial representation of part of one of the surfaces 10 or 11 is shown in FIG. 2. Conveniently, the protrusions 12 are produced by cold-rolling the layers 8 and 9 prior to the assembly of the components of the conductor 2.

The composite strip insulator 3 consists of two layers 14 and 15 of the same zirconium-copper alloy as is used for the layers 8 and 9. Sandwiched between the layers 14 and 15 is a layer 16 of an enamel material such as glass or a ceramic which forms the actual insulation between the turn 1 and 4 of the winding. The layers 14 and 15 are of equal thickness, the layer 16 is thin (some 50 μm). Thus it occupies the neutral axis of the composite strip 3, which can be bent through considerable angles without cracking the insulating layer 16.

When the winding is made, the conductor 2 and the composite strip 3 are fed into the winding machine together. The conductor 2 and the composite strip 3 are then heated to a temperature sufficient to cause the solder to melt, thus joining together the components of the winding to form a single body of considerable mechanical strength.

With protrusions 12 of the size described, the thermal and electrical contact between the layers 8 and 14 and 9 and 15, respectively, are sufficiently good to be considered as one item from the points of view of cooling and stabilisation of the superconducting layer 5. Furthermore, the thermal conductivity across the winding as a whole is high, which improves the quench characteristics of the winding and reduces the likelihood of excessive thermal stresses being generated in use. The spaces between the protrusions 12 when the winding is assembled provide cooling channels through which a cryogenic liquid such as liquid helium can be circulated.

Either the complete winding can be immersed in the cryogenic liquid, or raised edges can be formed on the edges of the conductor 2 such as to butt against the layers 14 and 15 and when sealed with solder form channels through which the cryogenic liquid can be circulated. If this form of construction is used, it is necessary to leave regions of the conductor 2 without raised edges to provide for the ingress and egress of the cryogenic liquid.

We claim:

1. An electric winding comprising a plurality of turns of a strip conductor consisting of a layer of a material which can be rendered superconducting sandwiched between two metallic layers of equal thickness adapted to thermally stabilise the layer of material which can be rendered superconducting when it is in the superconducting state, and interposed between each turn of the strip conductor in the winding a composite strip comprising a layer of insulating material sandwiched between two layers of metal so as to occupy the neutral axis of the composite strip.

2. An electrical winding according to claim 1 wherein the outer layers of the composite strip are made of the same thermally stabilising metal as the outer layers of the strip conductor.

3. An electrical winding according to claim 1 wherein the outer surfaces of the layers of thermally stabilising metal of the strip conductor have formed thereon a plurality of flat-topped protrusions of equal height, so that a plurality of cooling channels is formed throughout the winding through which a cooling medium can be caused to circulate.

4. An electrical winding according to claim 3 wherein the thermally stabilising metal is an alloy of zirconium and copper, and the material which can be rendered superconducting is an alloy of niobium and tin.

5. An electrical winding according to claim 1 in which the insulating material in the composite strip is a glass or a ceramic.

6. A strip conductor for use in an electrical winding according to claim 1 comprising a layer of an alloy of niobium and tin which can be made to be superconducting, a layer of an alloy of tin and bronze in intimate contact with each surface of the layer of niobium-tin alloy, and a layer of an alloy of zirconium and copper in intimate contact with each layer of tin-bronze alloy, the outer surfaces of the layers of zirconium-copper alloy having formed thereon a plurality of flat-topped protrusions of equal height.

7. An electric winding comprising a plurality of turns of a strip conductor consisting of a layer of a material which can be rendered superconducting sandwiched between two metallic layers adapted to thermally stabilise the layer of material which can be rendered superconducting when it is in the superconducting state, and interposed between each turn of the strip conductor in the winding a composite strip comprising a layer of insulating material sandwiched between two layers of metal so as to occupy the neutral axis of the composite strip.

8. An electrical winding according to claim 7 wherein the outer layers of the composite strip are made of the same thermally stabilising metal as the outer layers of the strip conductor.

9. An electrical winding according to claim 7 wherein the outer surfaces of the layers of thermally stabilising metal of the strip conductor have formed thereon a plurality of flat-topped protrusions of equal height, so that a plurality of cooling channels is formed throughout the winding through which a cooling medium can be caused to circulate.

10. An electrical winding according to claim 9 wherein the thermally stabilising metal is an alloy of zirconium and copper, and the material which can be rendered superconducting is an alloy of niobium and tin.

11. An electrical winding according to claim 7 in which the insulating material in the composite strip is a glass or a ceramic.

12. A strip conductor for use in an electrical winding according to claim 7 comprising a layer of an alloy of niobium and tin which can be made to be superconducting, a layer of an alloy of tin and bronze in intimate contact with each surface of the layer of niobium-tin alloy, and a layer of an alloy of zirconium and copper in intimate contact with each layer of tin-bronze alloy, the outer surfaces of the layers of zirconium-copper alloy having formed thereon a plurality of flat-topped protrusions of equal height.

13. A composite strip conductor for use in the production of an electrical winding comprising a layer of material which can be rendered superconducting sandwiched between two metallic layers adapted to thermally stabilise the sandwiched layer when it is in the superconducting state and wherein the outer surfaces of the layers of thermally stabilising metal have formed thereon a plurality of flat-topped protrusions of equal height so that a plurality of cooling channels can be formed throughout the winding through which a cooling medium can be caused to circulate.

* * * * *